(12) United States Patent
Bae et al.

(10) Patent No.: US 7,981,737 B2
(45) Date of Patent: Jul. 19, 2011

(54) THIN FILM TRANSISTOR ARRAY PANEL AND METHOD FOR MANUFACTURING THE SAME

(75) Inventors: Ju-Han Bae, Suwon-si (KR); Kyu-Young Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 167 days.

(21) Appl. No.: 12/474,116

(22) Filed: May 28, 2009

(65) Prior Publication Data

US 2010/0072483 A1    Mar. 25, 2010

(30) Foreign Application Priority Data

Sep. 22, 2008  (KR) .................. 10-2008-0092764

(51) Int. Cl.
*H01L 33/00* (2010.01)
*H01L 21/336* (2006.01)

(52) U.S. Cl. ..... 438/158; 257/72; 257/40; 257/E33.053; 257/E21.414; 438/155; 438/156; 438/157

(58) Field of Classification Search .................. 257/72; 438/155–158
See application file for complete search history.

(56) References Cited

U.S. PATENT DOCUMENTS

| | | | |
|---|---|---|---|
| 5,578,513 A * | 11/1996 | Maegawa | 438/151 |
| 2003/0085406 A1* | 5/2003 | Cheng | 257/72 |
| 2004/0041958 A1* | 3/2004 | Hwang et al. | 349/43 |
| 2004/0094766 A1* | 5/2004 | Lee et al. | 257/72 |

* cited by examiner

*Primary Examiner* — David Vu
*Assistant Examiner* — Jonathan Han
(74) *Attorney, Agent, or Firm* — Innovation Counsel LLP

(57) ABSTRACT

A thin film transistor array panel according to the present invention includes: a gate line formed on a substrate and including a gate electrode; a gate insulating layer formed on the gate electrode; a mold layer formed on the gate insulating layer and having an opening overlapping the gate electrode; a semiconductor layer filled in the opening; a data line formed on the mold layer and including a source electrode contacted with the semiconductor layer; a drain electrode contacted with the semiconductor layer on the mold layer and facing the source electrode; a passivation layer formed on the data line and the drain electrode; and a pixel electrode formed on the passivation layer and connected to the drain electrode, wherein the passivation layer, the source electrode, and the drain electrode have at least one through-hole connected to the opening.

9 Claims, 8 Drawing Sheets

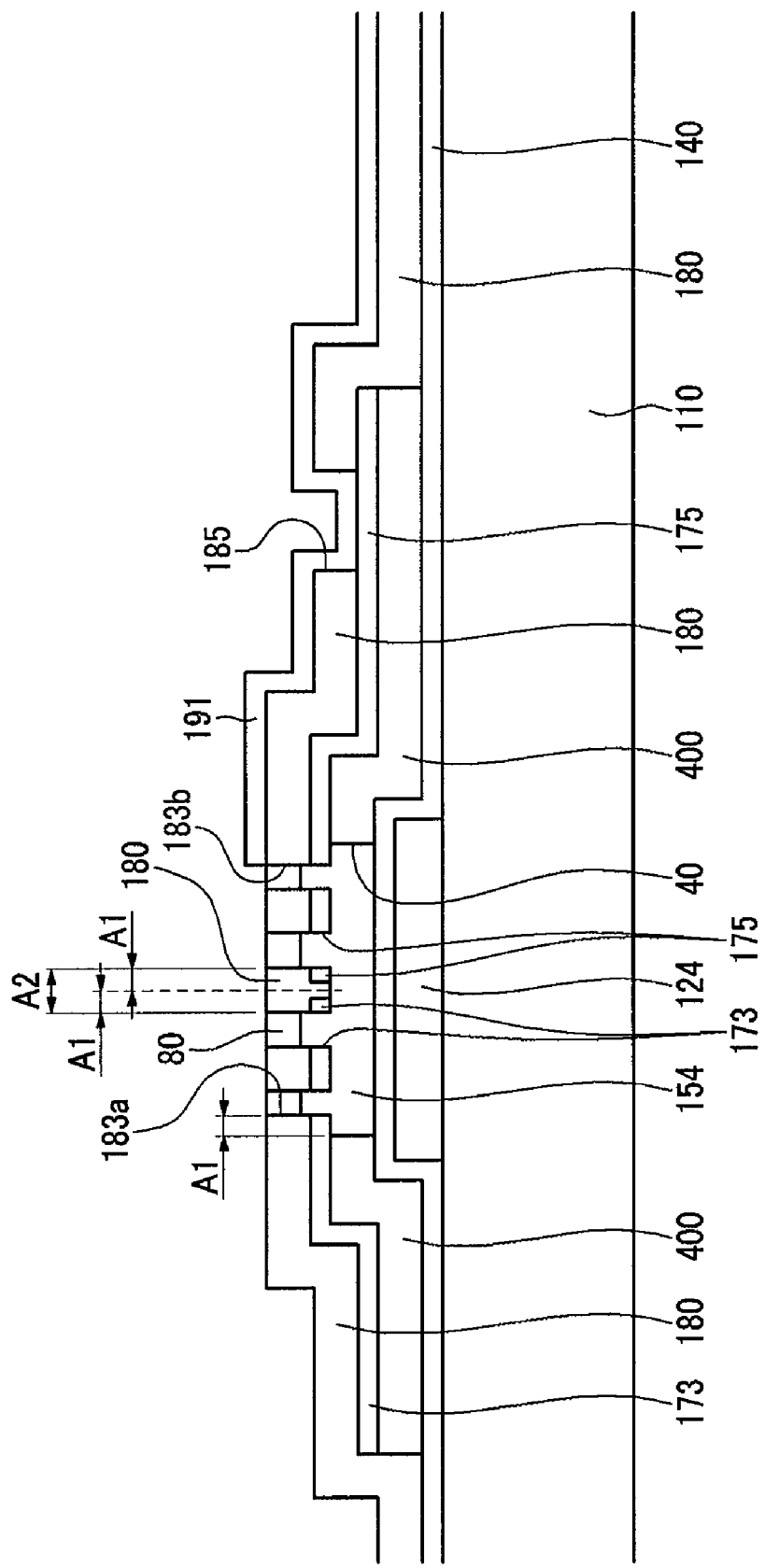

THIN FILM TRANSISTOR ARRAY PANEL AND METHOD FOR MANUFACTURING THE SAME

CROSS-REFERENCE TO RELATED APPLICATION

This application claims priority to and the benefit of Korean Patent Application No. 10-2008-0092764 filed in the Korean Intellectual Property Office on Sep. 22, 2008, the entire contents of which are incorporated herein by reference.

BACKGROUND OF THE INVENTION

1. Field of the Invention

The present invention relates to a thin film transistor array panel and a manufacturing method thereof.

2. Description of the Related Art

Generally, a flat panel display, such as a liquid crystal display (LCD), an organic light emitting diode (OLED) display, and an electrophoretic display, includes a plurality of pairs of field generating electrodes and an electro-optical activation layer disposed therebetween. The liquid crystal display includes a liquid crystal layer as the electro-optical activation layer, and the organic light emitting diode display includes an organic emission layer as the electro-optical activation layer.

One of the pair of field generating electrodes is generally connected to a switching element so as to receive an electrical signal, and the electro-optical activation layer converts the electrical signal to an optical signal to thereby display images.

In the flat panel display, a thin film transistor (TFT), which includes a gate electrode, a source electrode, a drain electrode, and a semiconductor, is used as the switching element, and a gate line transmitting a scanning signal for controlling the thin film transistor and a data line transmitting a signal applied to a pixel electrode are provided to the flat panel display.

In the field of thin film transistors, research including a semiconductor formed through a solution process is actively being undertaken.

A semiconductor can be manufactured by a solution process, so it can be easily applied to a large flat panel display limited by a deposition process.

However, unlike a conventional deposition process, the solution process requires an additional process for forming a bank for sealing the solution.

The above information disclosed in this Background section is only for enhancement of understanding of the background of the invention and therefore it may contain information that is not prior art known to a person of ordinary skill in the art.

SUMMARY OF THE INVENTION

Accordingly, the present invention provides a thin film transistor array panel and a manufacturing method thereof including an organic semiconductor while using the conventional process.

A thin film transistor array panel according to an exemplary embodiment of the present invention includes: a gate line formed on a substrate including a gate electrode; a gate insulating layer formed on the gate electrode; a mold layer formed on the gate insulating layer and having an opening overlapping the gate electrode; a semiconductor layer filling in the opening; a data line formed on the mold layer including a source electrode which is contact with the semiconductor; a drain electrode contacting the semiconductor layer on the mold layer and facing the source electrode; a passivation layer formed on the data line and the drain electrode; and a pixel electrode formed on the passivation layer and connected to the drain electrode, wherein the passivation layer, the source electrode, and the drain electrode have at least one through-hole connected to the opening.

An overcoat covering the semiconductor may be formed in the through-hole.

The through-hole may include a first through-hole formed in the passivation layer and the source electrode, and a second through-hole formed in the passivation layer and the drain electrode.

The boundaries of the first through-hole and the second through-hole may be disposed at the boundary of the opening.

A first distance as the shortest distance from the boundary of the opening to the first through-hole or a second distance as the shortest distance from the boundary of the opening to the second through-hole may be more than 3 μm.

The distance between the neighboring first through-holes or the distance between the neighboring second through-holes may be more than twice the first distance or the second distance.

The distance between the boundary of the first through-hole nearest to the channel between the source electrode and the drain electrode, and the boundary of the second through-hole nearest to the channel, may be less than twice the first distance or the second distance.

The semiconductor layer comprises an organic semiconductor.

The gate insulating layer and the mold layer may have the same composition but different densities, and the gate insulating layer may be denser and more solid than the mold layer.

The mold layer may be made of a metal having an etch rate that is different from the etch rate of data line and drain electrode.

A manufacturing method of a thin film transistor array panel includes: forming a gate line including a gate electrode on a substrate; forming a gate insulating layer, a buffer layer, and a metal layer on the gate line; patterning the metal layer and the buffer layer by photolithography to form a data line including a source electrode and a drain electrode, and a mold layer pattern; forming a passivation layer having a contact hole exposing the drain electrode on the data line and the drain electrode; forming a transparent conductive layer connected to the drain electrode through the contact hole on the passivation layer; patterning the transparent conductive layer, the passivation layer, the source electrode and the drain electrode by photolithography to form a pixel electrode and a through-hole exposing the mold layer pattern; etching the exposed mold layer pattern through the through-hole to form a mold layer having an opening connected to the through-hole; and filling a semiconductor in the opening through the through-hole.

The gate insulating layer and the buffer layer may be made of materials having different etch rate.

The gate insulating layer and the buffer layer may have the same composition but different densities, and the gate insulating layer may be formed at a higher temperature than the buffer layer.

The gate insulating layer may be formed at a temperature of more than 220° C., and the buffer layer may be formed at a temperature of less than 130° C.

In the forming of the mold layer, the mold layer pattern may be over-etched after exposing the gate insulating layer, and the neighboring first through-hole or the neighboring second through-hole may be connected by the opening through the over-etch.

The through-hole may include a first through-hole passing through the source electrode and a second through-hole passing through the drain electrode.

The patterning of the transparent conductive layer, the passivation layer, the source electrode, and the drain electrode by photolithography to form the pixel electrode and the through-hole exposing the mold layer pattern includes forming a first photosensitive film pattern including a first portion and a second portion thicker the first portion on the transparent conductive layer, etching the transparent conductive layer, the passivation layer, the source electrode, and the drain electrode by using the first photosensitive film pattern as a mask to form the through-hole, developing the first photosensitive film pattern to remove the first portion, and etching the transparent conductive layer to form the pixel electrode.

The first photosensitive film pattern may expose the transparent conductive layer corresponding to the through-hole, and the second portion may be disposed corresponding to the pixel electrode.

A gate contact assistant connected to an end portion of the gate line and a data contact assistant connected to an end portion of the data line may be formed along with the pixel electrode.

The patterning of the metal layer and the buffer layer by photolithography to form a data line including a source electrode and a drain electrode, and a mold layer pattern, includes forming a second photosensitive film pattern including a third portion and a fourth portion thicker than the third portion on the metal layer, etching the metal layer and the buffer layer by using the second photosensitive film pattern as a mask to form an incomplete data pattern and the mold layer pattern, developing the third photosensitive film pattern to remove the third portion, and etching the incomplete data pattern that is exposed by the removal of the third portion to form the source electrode and the drain electrode.

The filling of the organic semiconductor in the opening may be executed by Inkjet printing.

After forming the pixel electrode, the organic semiconductor is finally formed such that the organic semiconductor is prevented from being damaged, thereby increasing the efficiency of the thin film transistor.

BRIEF DESCRIPTION OF THE DRAWINGS

FIG. 8 is a cross-sectional view of a thin film transistor array panel according to another exemplary embodiment of the present invention and taken along the line II-II of FIG. 1.

DESCRIPTION OF REFERENCE NUMERALS INDICATING PRIMARY ELEMENTS IN THE DRAWINGS

Figure 1:
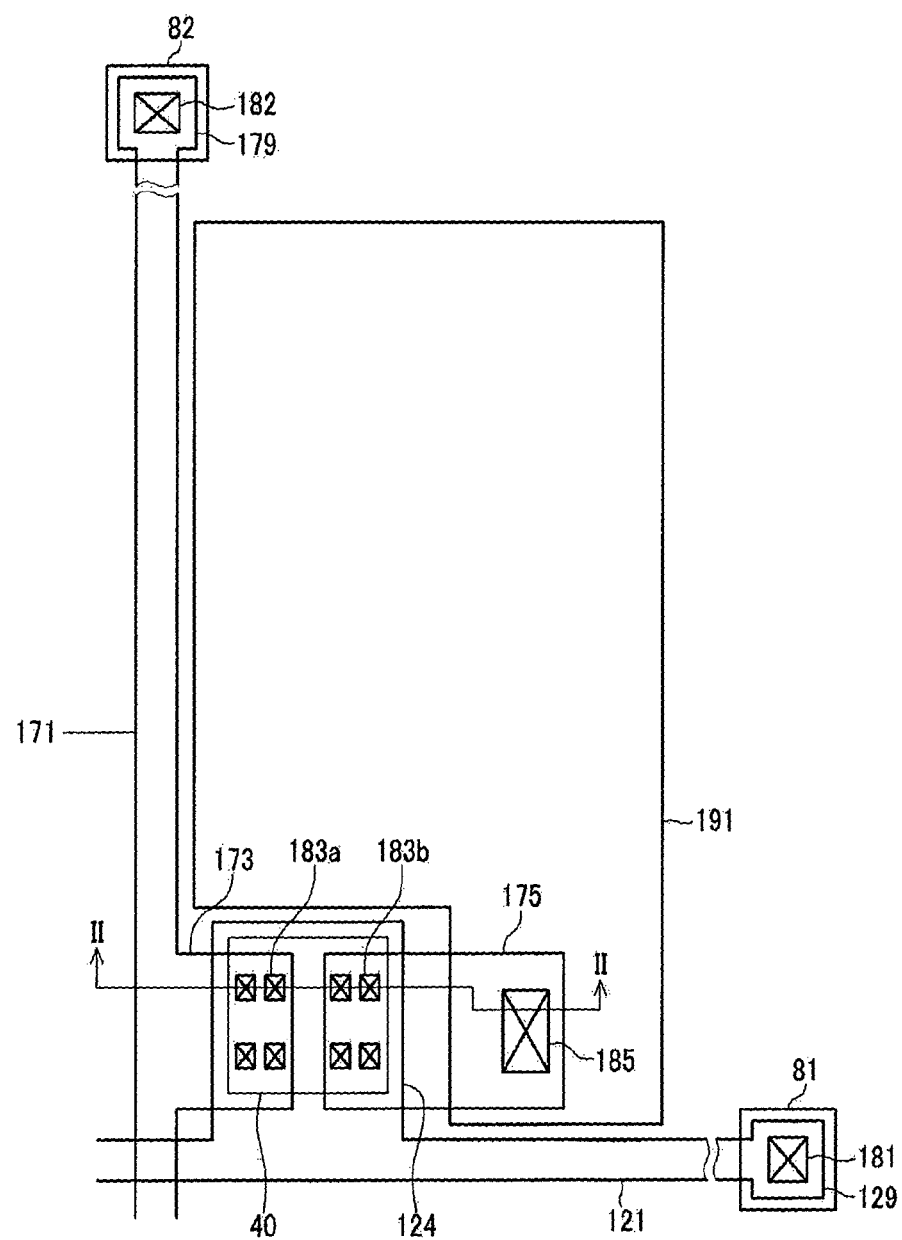
FIG. 1 is a layout view of a thin film transistor array panel according to an exemplary embodiment of the present invention.

| 40: opening | 80: overcoat |
| 110: insulation substrate | |
| 121: gate line | 124: gate electrode |
| 140: gate insulating layer | 154: organic semiconductor |
| 163, 165: ohmic contact | |
| 171: data line | 173: source electrode |
| 175: drain electrode | 180: passivation layer |
| 183a, 183b: through-hole | 185: contact hole |
| 191: pixel electrode | 400: mold layer |

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A thin film transistor array panel according to an exemplary embodiment of the present invention will be described with reference to FIG. 1 to 3.

Figure 2:
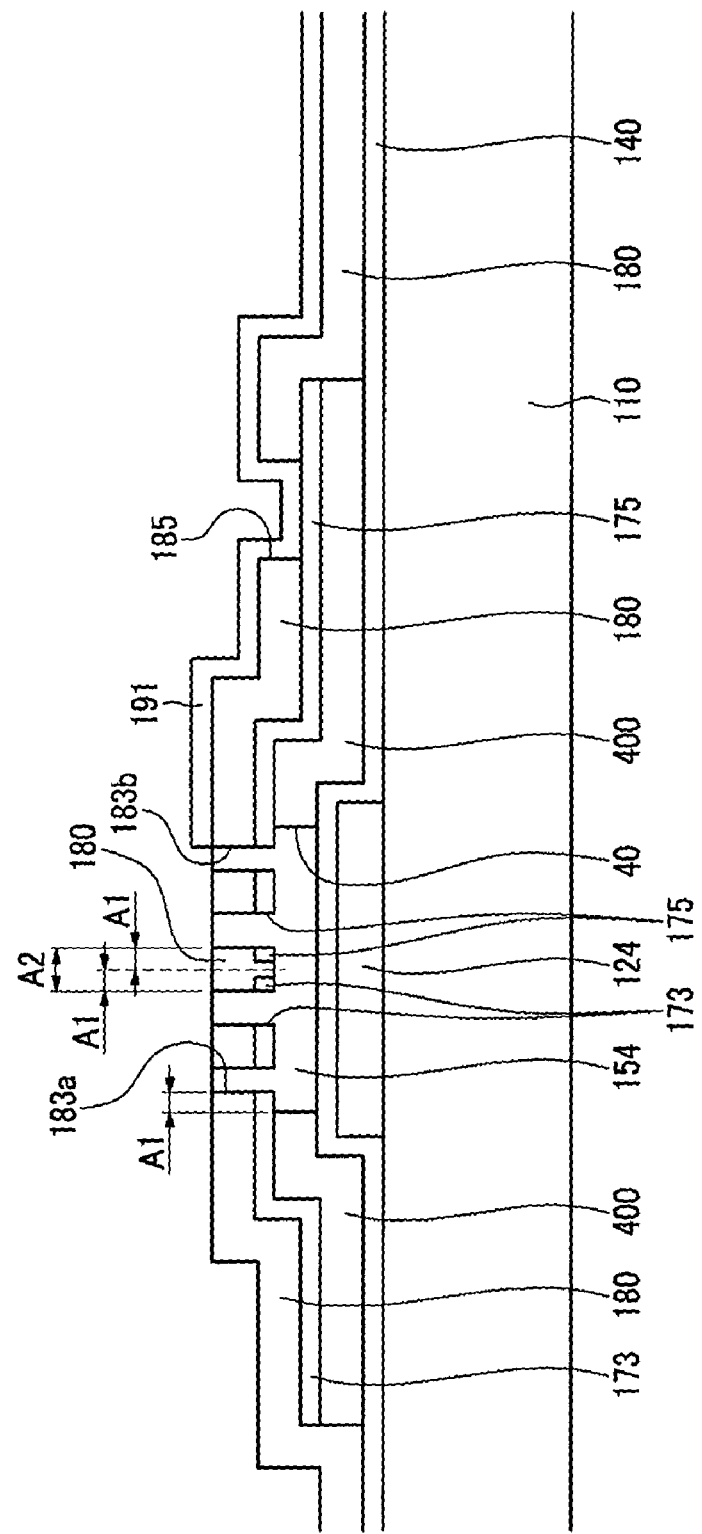
FIG. 2 is a cross-sectional view of the thin film transistor array panel shown in FIG. 1 taken along the line II-II.
Figure 3:
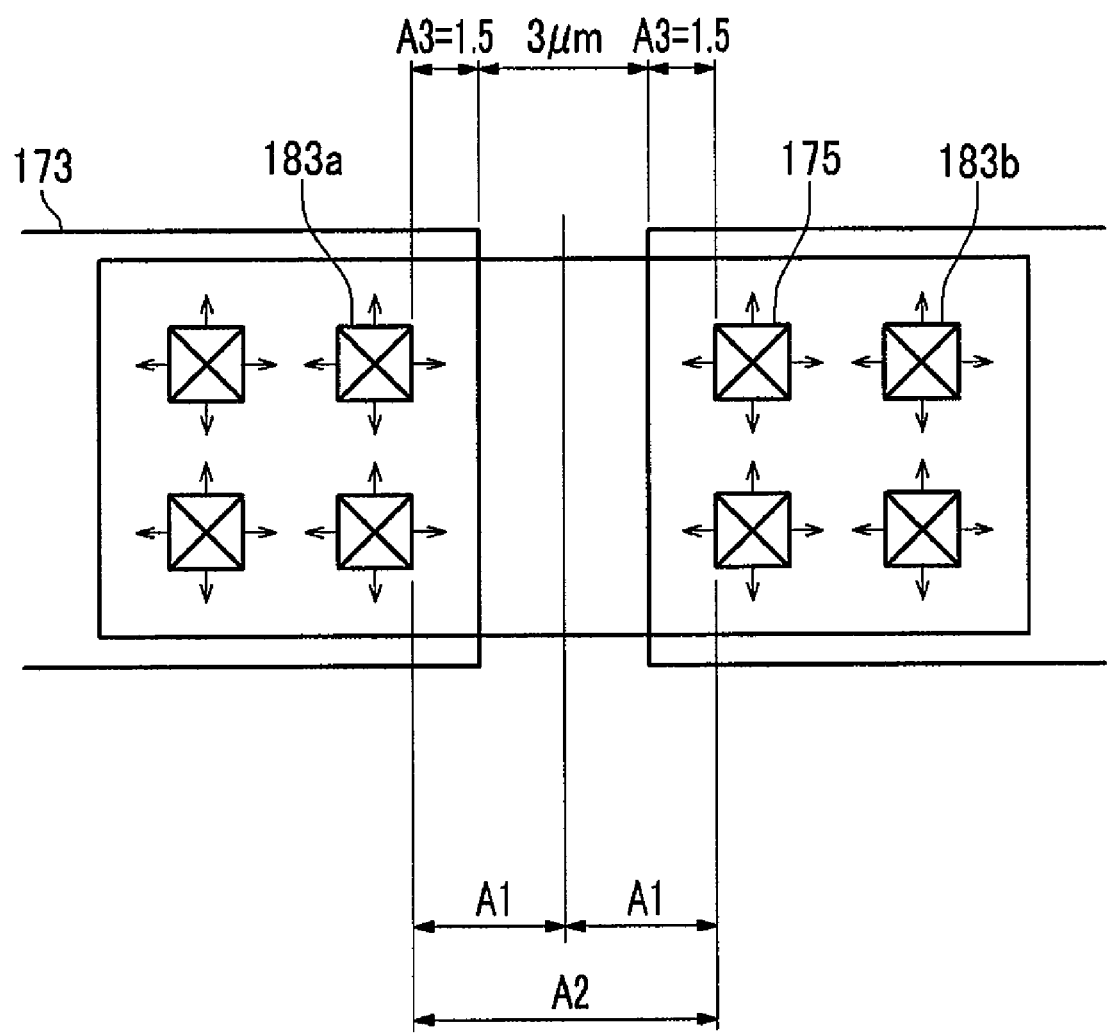
FIG. 3 is an enlarged cross-sectional view of a portion of the thin film transistor array panel shown in FIG. 1.

FIG. 1 is a layout view of a thin film transistor array panel according to an exemplary embodiment of the present invention, FIG. 2 is a cross-sectional view of the thin film transistor array panel shown in FIG. 1 taken along the line II-II, and FIG. 3 is an enlarged cross-sectional view of a portion of the thin film transistor array panel shown in FIG. 1.

A gate line 121 is formed on an insulation substrate 110 made of transparent glass, silicone, or plastic.

The gate lines 121 transmit gate signals and substantially extend in a first direction. Each gate line 121 includes a plurality of gate electrodes 124 extending from the gate line 121, and an end portion 129 having a large area for contact with another layer or an external driving circuit.

A gate insulating layer 140 is formed on the gate line 121. The gate insulating layer 140 is made of silicon oxide or silicon nitride.

A mold layer 400 is formed on the gate insulating layer 140, and a data line 171 and a drain electrode 175 are formed on the mold layer 400. The mold layer and the gate insulating layer may have the same composition but different densities.

The mold layer 400 has a plurality of openings 40 extending to the gate insulating layer 140. The mold layer 400 may be made of a photosensitive organic material, or of silicon oxide or silicon nitride.

The data line 171 transmits data signals and extends in a second direction that is substantially perpendicular to the first direction. Each data line 171 includes a plurality of source electrodes 173 extending toward the gate electrodes 124, and an end portion 179 having a large area for contact with another layer or an external driving circuit.

The data line 171 and the drain electrode 175 may be made of a metal having low resistance such as chromium (Cr), molybdenum (Mo), tantalum (Ta), and titanium (Ti), and they may prevent a signal delay as low resistance wiring.

The source electrode 173 and the drain electrode 175 directly contact an organic semiconductor 154 that will be described, such that it is preferable that the source electrode 173 and the drain electrode 175 are made of a conductive material. The conductive material is selected to reduce the work function difference between the source electrode 173 and the organic semiconductor, and also between the drain electrode 175, and the organic semiconductor. The source electrode 173 and the drain electrode 175 may simultaneously have the function of an ohmic contact reducing the Schottky barrier between the organic semiconductor and the electrodes in this case. A passivation layer 180 is formed on the data line 171 and the drain electrode 175.

The passivation layer 180 and source electrode 173 have a plurality of first through-holes 183a connected to the openings 40, and the passivation layer 180 and the drain electrode 175 have a plurality of second through-holes 183b connected to the openings 40. Also, the passivation layer 180 has contact-holes 185 and 182 exposing the drain electrode 175 and the end portion 179, and the passivation layer 180 and the gate insulating layer 140 have a contact hole 181 exposing the end portion 129.

The boundaries of the openings 40 are preferably within the boundaries of the gate electrodes 124, the boundaries of the first and second through-holes 183a and 183b are disposed within the boundary of the opening 40.

For convenience of description, the portion between the source electrode 173 and the drain electrode 175 is referred to as a channel.

The outer boundaries of the first and second through-holes 183a and 183b that are disposed further away from the channel are at a distance Al from the boundary of the opening 40. Therefore an undercut is formed on the mold layer 400 under the source electrode 173 and the drain electrode 175, as shown in the cross-section of FIG. 2.

The distance between the two neighboring first through-holes 183a, or the two neighboring second through-holes 183b, is less than twice the distance Al. Also, the distance A2 between the channel, and the first and second neighboring through-holes 183a and 183b, is less than twice the distance A1.

A pixel electrode 191 and contact assistants 81 and 82 are formed on the passivation layer 180. The pixel electrode 191 is connected to the drain electrode 175 through the contact hole 185 and receives the data voltages from the drain electrode 175. The contact assistants 81 and 82 are respectively connected to the exposed end portions 129 and 179 of the gate lines 121 and the data lines 171 through the contact holes 181 and 182, and protect the exposed end portions 129 and 179 of the gate lines 121 and the data lines 171 and complement the adhesion between the exposed portions and external devices such as a driving integrated circuit.

The opening 40, and the first and second through-holes 183a and 183b, are filled with the organic semiconductor layer 154.

The organic semiconductor layer 154 may include a high molecular weight compound and a low molecular weight compound that are dissolved in an aqueous solution or an organic solvent and formed by an Inkjet printing method. However, the organic semiconductor 154 may be formed by another solution process such as spin coating or slit coating, or a deposition process.

The organic semiconductor layer 154 may include a material selected from the group consisting of polythienylenevinylene, poly3-hexylthiophene, polythiophene, phthalocyanine, metalized phthalocyanine, and halogenation derivatives thereof. The organic semiconductor layer 154 may include one selected from the group consisting of perylenetetracarboxylic dianhydride (PTCDA), naphthalenetetracarboxylic dianhydride (NTCDA), and imide derivatives thereof. The organic semiconductor layer 154 may include a derivative including perylene and coronene, and substitution groups thereof.

A gate electrode 124, a source electrode 173, and a drain electrode 175 form a thin film transistor (TFT) along with the organic semiconductor layer 154, and the channel of the thin film transistor is formed in the organic semiconductor layer 154 between the source electrode 173 and the drain electrode 175.

The pixel electrode 191 and the contact assistants 81 and 82 may be made of a transparent conductive material or a reflective metal.

Next, a manufacturing method of the thin film transistor shown in FIG. 1 and FIG. 2 will be described with reference to FIG. 4 to 7 as well as FIG. 1 to 3.

FIG. 4 to FIG. 7 are cross-sectional views sequentially showing steps in the manufacturing method of a thin film transistor array panel according to the present invention.

Figure 4:
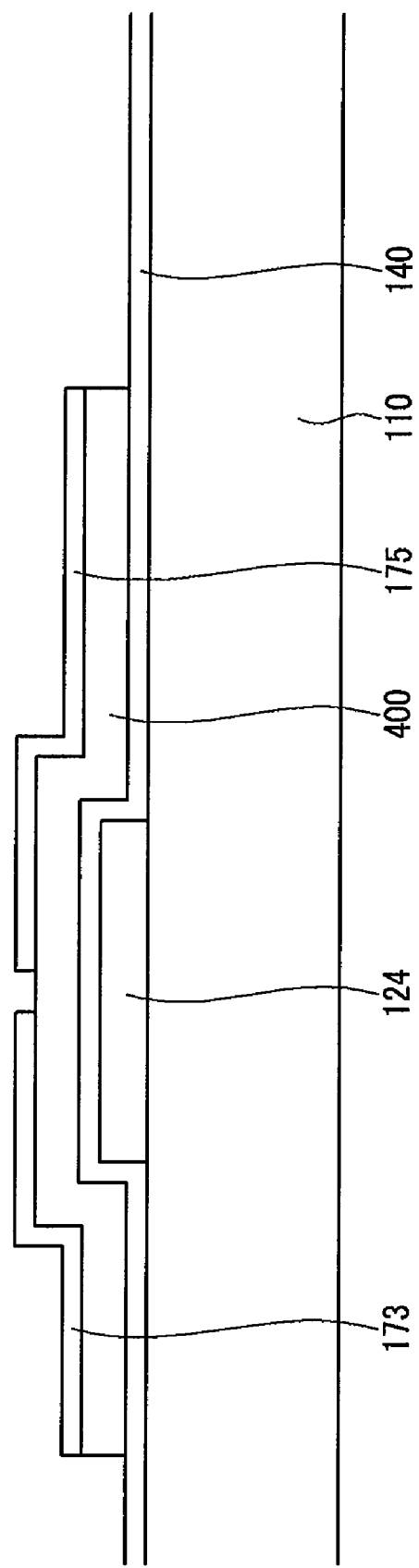
FIG. 4 to FIG. 7 are cross-sectional views sequentially showing intermediate steps in the manufacturing method of a thin film transistor array panel according to the present invention.

First, as shown in FIG. 4, a metal layer is deposited on a substrate 110, and patterned by photolithography to form a gate line 121 including gate electrodes 124.

Then, a gate insulating layer 140 made of silicon oxide or silicon nitride is formed on the substrate 110 and the gate electrodes 124.

A buffer layer made of an insulating material such as an organic material or silicon oxide is deposited on the gate insulating layer 140. The buffer layer is formed of a material having a different etch rate from the etch rate of the gate insulating layer 140. For example, the formation temperature of the silicon nitride layer may be varied to enable the etch selectivity difference. That is, the gate insulating layer is deposited at a temperature higher than 220° C. such that the film becomes dense thereby forming a rigid layer, and the buffer layer is deposited at a temperature of less than 130° C. such that the film is not denser than the gate insulating layer, thereby forming a soft layer.

Next, a conductive metal is deposited on the buffer layer to form a data metal layer.

Next, a photosensitive film pattern, having different thicknesses depending on positions, is formed on the data metal layer, and the data metal layer is etched by using the photosensitive film pattern as a mask to form a data line 171, a source electrode 173 and a drain electrode 175, and a mold layer pattern 4.

The photosensitive film pattern having the different thicknesses may be formed by using a slit or a half tone mask, wherein a first portion of one thickness is disposed between the source electrode 173 and the drain electrode 175, and a second portion that is thicker than the first portion is disposed on the source data line 171 and the drain electrode 175.

After etching the data metal layer and a buffer layer by using the photosensitive film pattern as a mask, the photosensitive film pattern is ashed to remove the first portion, and then the data metal layer is etched by using the second portion as a mask to separate the source electrode 173. and the drain electrode 175 from each other, thereby completing the source electrode 173 and the drain electrode 175.

The data metal layer and the buffer layer may be formed by using an imprinting process.

Figure 5:
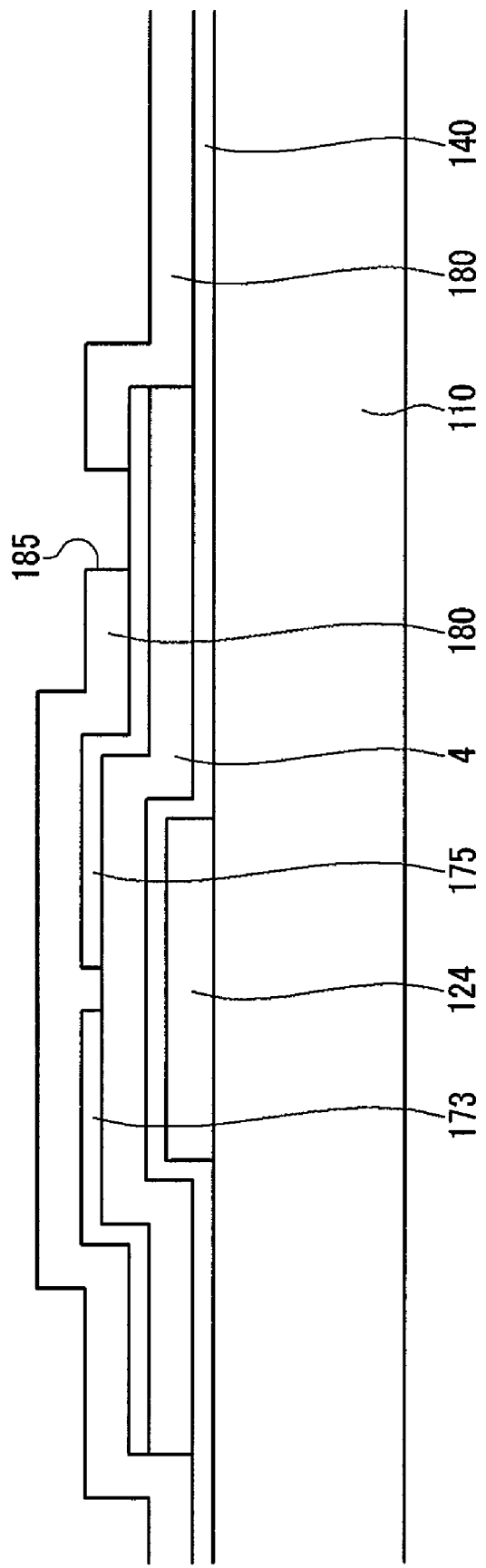

Next, as shown in FIG. 5, a passivation layer 180 of an organic material or inorganic material is formed on the source electrode 173 and the drain electrode 175.

Next, the passivation layer 180 is etched to form a contact hole 185 exposing the drain electrode 175.

Figure 6:
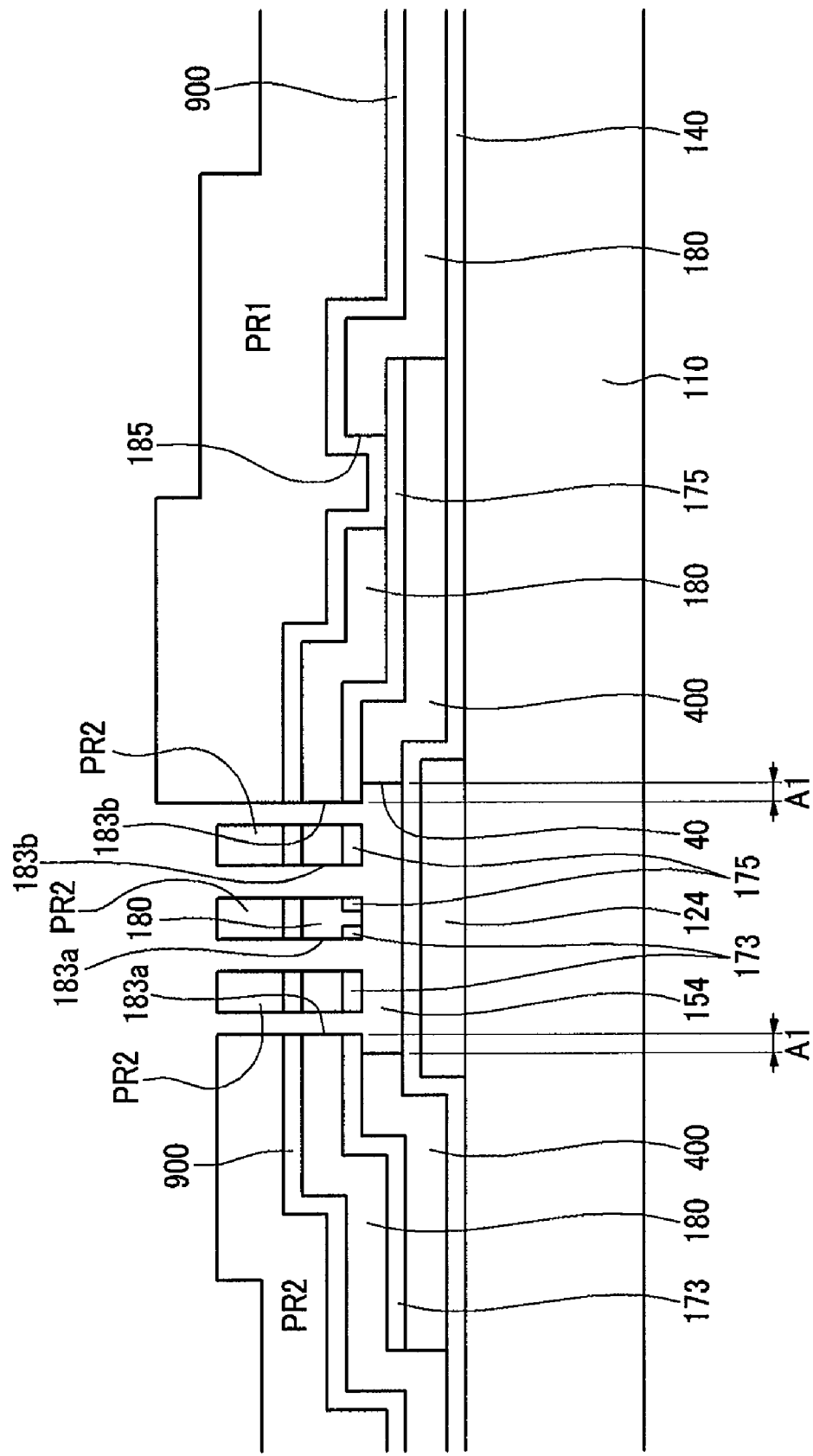

Next, as shown in FIG. 6, a transparent conductive layer 900 of ITO or IZO is formed on the substrate 110 including the contact hole 185.

Next, a photosensitive film is coated on the transparent conductive layer 900, and patterned by using a slit or half tone mask to form the first and second photosensitive film patterns PR1 and PR2.

The first photosensitive film pattern PR1 that corresponds to a pixel electrode of the pixel area is thicker than the second photosensitive film pattern PR2.

Next, the transparent conductive layer 900, the passivation layer 180, the source electrode 173, and the drain electrode 175 are etched by using the first and second photosensitive film patterns PR1 and PR2 as a mask to form the first and second through-holes 183a and 183b exposing the mold layer pattern. The mold layer pattern exposed through the first and second through-holes 183a and 183b is etched second time to form a mold layer 400 having an opening 40.

Here, the secondary etching is executed as an over-etch such that the mold layer pattern is etched under the corners of source electrode 173 and the drain electrode 175 after the exposure of the gate insulating layer 140, thereby forming an undercut around the corners of the source electrode and the drain electrode. Here, the etching is executed laterally as well as vertically in the direction of the curved line tips.

The gate insulating layer 140 and the mold layer 400 have similar composition, but may have significant etch rate difference such that the mold layer 400 is over-etched while the gate insulating layer 140 is intact.

The mold layer 400 may be formed of a material having a significant etch rate difference from that of the data metal layer.

Referring to FIG. 3 and FIG. 6, the channel of the semiconductor layer must be formed between the source electrode 173 and the drain electrode 175 such that the opening 40 is connected between the source electrode 173 and the drain electrode 175.

According to an exemplary embodiment of the present invention, the length of the channel between the source electrode 173 and the drain electrode 175 is in the range of about 3-4 μm such that it is preferable that the undercut A1 is in the range more than 3 μm. Here, the distance A2 between the first through-hole 183a and the second through-hole 183b is less than twice the length of the undercut A1.

For example, if the undercut A1 is 3 μm, it is respectively under the first and second through-holes 183a and 183b adjacent to the channel such that the distance A2 between the first through-hole 183a and the second through-hole 183b would be less than 6 μm.

Accordingly, if the channel length 3 μm is excluded, there is 3 μm remaining. Also, the interval A3 from the first through-hole 183a to a nearest boundary of the source electrode, boundary, and the interval A3 from the second through-hole 183b to a nearest boundary of the drain electrode may be both 1.5 μm.

In this case, the length A2 is twice the length A1. However if the length A2 is 7 μm, more than twice the length A1, and an undercut of only 3 μm is formed, the mold layer opening is etched short by 1 μm between two A1s such that the channel is not connected. Accordingly, it is preferable that the length A2 be less than twice the length A1.

Figure 7:
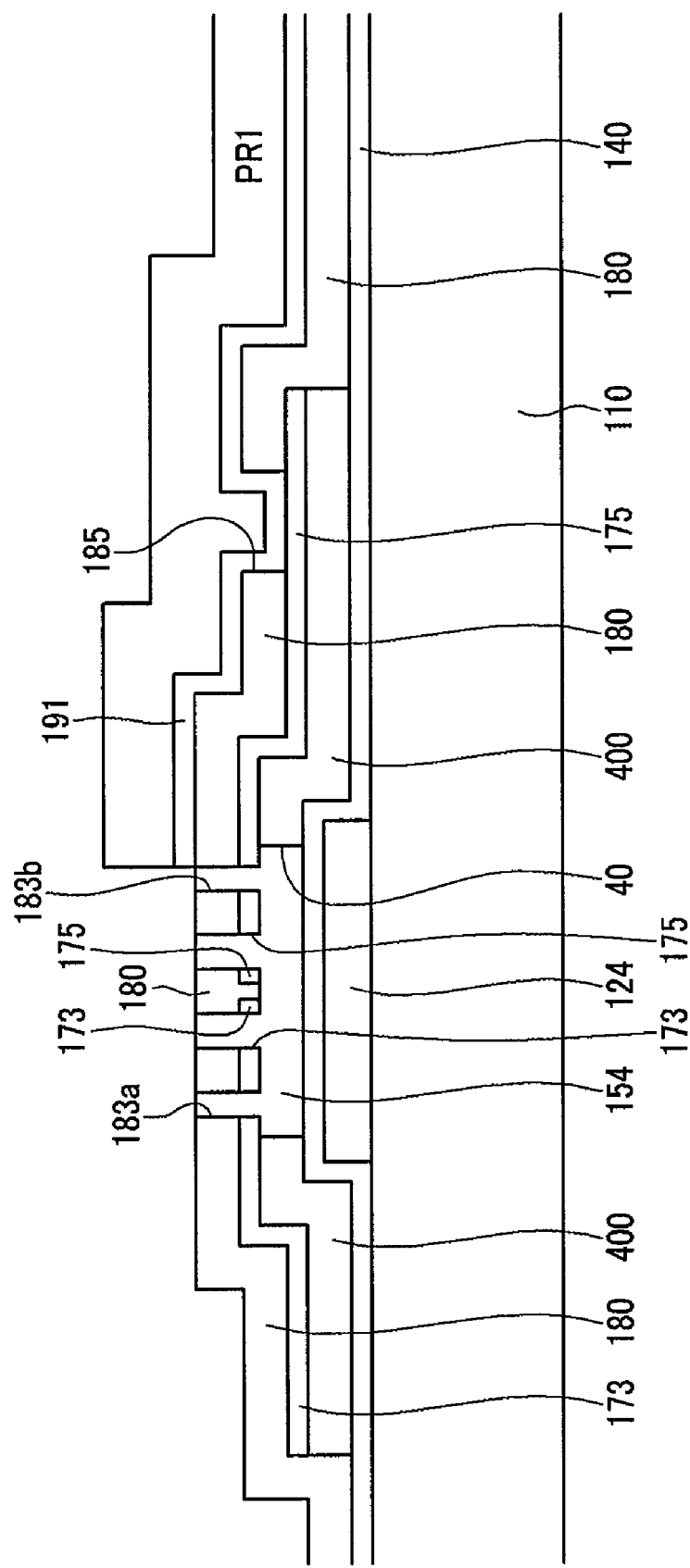

Next, as shown in FIG. 7, ashing is executed to remove the second photosensitive film pattern PR2, and the exposed transparent conductive layer 900 is etched by using the first photosensitive film pattern PR1 as a mask to form a pixel electrode 191. Referring to FIG. 1, a gate contact assistant 81 and a data contact assistant 82 may be formed along the pixel electrode 191. In this case, the second photosensitive film pattern PR2 is formed on the portion where the contact assistants 81 and 82 are disposed.

Next, as shown in FIG. 1, the first photosensitive film pattern PR1 is removed, and an organic semiconductor layer 154 is formed in the opening 40 by using an Inkjet printing method through the first and second through-holes 183a and 183b.

Before filling the opening 40 with organic semiconductor layer 154, the surfaces of the first and second through-holes 183a and 183b and the opening 40 are subjected to surface treatment using a gas including fluorine to provide a hydrophobic property. Next, if the organic semiconductor solution is formed of a material having a hydrophilic property, the characteristic of the surfaces of the first and second through-holes 183a and 183b and the opening 40 is different from the characteristic of the organic semiconductor layer such that the organic semiconductor layer may be easily collected in the opening 40.

FIG. 8 is a cross-sectional view of a thin film transistor array panel according to another exemplary embodiment of the present invention.

Referring to FIG. 8, as shown in FIG. 7, after forming an organic semiconductor 154, an overcoat 80 of an insulating material of a solution type may be formed on the organic semiconductor 154. The overcoat 80 is formed in the through-holes 183a and 183b, and protects the exposed semiconductor 154. The overcoat 80 may be formed by the Inkjet printing method like the organic semiconductor 154. Here, the organic semiconductor 154 does not completely fill the first and second through-holes 183a and 183b.

Accordingly, in an exemplary embodiment of the present invention, the organic semiconductor layer 154 is formed after forming the pixel electrode 191 to prevent the surface of the organic semiconductor layer 154 may be protected from being exposed to and damaged by the chemical solution or plasma in the etch process. Hence, the insertion forms a thin film transistor having stable channel characteristics.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor array panel, comprising:
   forming a gate line including a gate electrode on a substrate;
   forming a gate insulating layer, a buffer layer, and a metal layer on the gate line;
   patterning the metal layer and the buffer layer by photolithography to form a data line including a source electrode and a drain electrode, and a mold layer pattern;
   forming a passivation layer having a contact hole exposing the drain electrode on the data line and the drain electrode;
   forming a transparent conductive layer connected to the drain electrode through the contact hole on the passivation layer;
   patterning the transparent conductive layer, the passivation layer, the source electrode, and the drain electrode by photolithography to form a pixel electrode and a through-hole exposing the mold layer pattern;
   etching the exposed mold layer pattern through the through-hole to form a mold layer having an opening connected to the through-hole; and
   filling a semiconductor in the opening through the through-hole.

2. The method of claim 1, wherein
the gate insulating layer and the buffer layer are made of materials having large etch rate difference.

3. The method of claim 2, wherein
the gate insulating layer and the buffer layer are made of the same material, and
the gate insulating layer is formed at a higher temperature than the buffer layer.

4. The method of claim 3, wherein:
the gate insulating layer is formed at a temperature higher than 220° C., and
the buffer layer is formed at a temperature lower than 130° C.

5. The method of claim 1, wherein,
in the forming of the mold layer,
the mold layer pattern is over-etched after exposing the gate insulating layer.

6. The method of claim 1, wherein
the through-hole includes a first through-hole passing through the source electrode and a second through-hole passing through the drain electrode.

7. The method of claim 6 wherein
the neighboring first through-hole or the neighboring second through-hole are connected by the opening through the over-etching.

8. The method of claim 1, wherein
the patterning of the transparent conductive layer, the passivation layer, the source electrode, and the drain electrode by photolithography to form the pixel electrode and the through-hole exposing the mold layer pattern comprises:
forming a first photosensitive film pattern including a first portion and a second portion thicker the first portion on the transparent conductive layer;
etching the transparent conductive layer, the passivation layer, the source electrode, and the drain electrode by using the first photosensitive film pattern as a mask to form the through-hole;
ashing the first photosensitive film pattern to remove the first portion; and
etching the transparent conductive layer to form the pixel electrode.

9. The method of claim 8, wherein
the first photosensitive film pattern exposes the transparent conductive layer corresponding to the through-hole, and the second portion is disposed corresponding to the pixel electrode.

* * * * *